US009852802B2

United States Patent
Yoo

(10) Patent No.: US 9,852,802 B2
(45) Date of Patent: Dec. 26, 2017

(54) MEMORY SYSTEM WITH MULTIPLE PROGRAMMING MODES

(71) Applicant: SAMSUNG ELECTRONICS CO., LTD., Suwon-si, Gyeonggi-Do (KR)

(72) Inventor: Sang-Wook Yoo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 15/141,389

(22) Filed: Apr. 28, 2016

(65) Prior Publication Data

US 2017/0068481 A1    Mar. 9, 2017

(30) Foreign Application Priority Data

Sep. 9, 2015   (KR) .................. 10-2015-0127749

(51) Int. Cl.
  *G11C 16/34*   (2006.01)
  *G06F 3/06*    (2006.01)
  *G11C 16/10*   (2006.01)

(52) U.S. Cl.
  CPC ........ *G11C 16/3431* (2013.01); *G06F 3/0611* (2013.01); *G06F 3/0616* (2013.01); *G06F 3/0634* (2013.01); *G06F 3/0659* (2013.01); *G06F 3/0679* (2013.01); *G11C 16/10* (2013.01)

(58) Field of Classification Search
  CPC ................................. G11C 16/3431
  See application file for complete search history.

(56) References Cited

U.S. PATENT DOCUMENTS

| | | | |
|---|---|---|---|
| 6,496,410 B1 * | 12/2002 | Parker ................ | G11C 11/5628 365/185.03 |
| 6,865,122 B2 | 3/2005 | Srinivasan | |
| 7,660,159 B2 * | 2/2010 | Hwang ................ | G11C 16/10 365/185.19 |
| 7,679,133 B2 | 3/2010 | Son et al. | |
| 7,984,084 B2 | 7/2011 | Sinclair | |
| 8,161,226 B2 | 4/2012 | Illendula et al. | |
| 8,305,811 B2 | 11/2012 | Jeon | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,705,279 B2 | 4/2014 | Kim | |
| 8,788,908 B2 * | 7/2014 | Yoon .................. | G06F 11/1072 714/766 |
| 9,620,226 B1 * | 4/2017 | Main ................... | G11C 16/08 |
| 9,704,595 B1 * | 7/2017 | Eyal .................. | G11C 16/3431 |
| 2006/0069850 A1 | 3/2006 | Rudelic | |
| 2011/0233648 A1 | 9/2011 | Seol et al. | |

(Continued)

FOREIGN PATENT DOCUMENTS

KR    1020140145063 A    12/2014

*Primary Examiner* — Harry W Byrne
*Assistant Examiner* — R Lance Reidlinger
(74) *Attorney, Agent, or Firm* — Volentine & Whitt, PLLC

(57) ABSTRACT

A memory system includes a nonvolatile memory device and a memory controller. The nonvolatile memory device has a first program mode and a second program mode. The second program mode programs data to have a larger read margin than the first program mode. The memory controller controls the nonvolatile memory device to program the data according to the second program mode for a read reclaim operation.

17 Claims, 15 Drawing Sheets

(56) References Cited

U.S. PATENT DOCUMENTS

| | | | |
|---|---|---|---|
| 2013/0151760 A1* | 6/2013 | Cho | G06F 12/0246 |
| | | | 711/103 |
| 2014/0047269 A1 | 2/2014 | Kim | |
| 2014/0101372 A1 | 4/2014 | Jung et al. | |
| 2014/0181370 A1 | 6/2014 | Cohen et al. | |
| 2014/0237165 A1* | 8/2014 | Seo | G06F 12/0246 |
| | | | 711/103 |
| 2014/0369124 A1 | 12/2014 | Moon et al. | |

* cited by examiner

MEMORY SYSTEM WITH MULTIPLE PROGRAMMING MODES

CROSS-REFERENCE TO RELATED APPLICATIONS

This U.S. non-provisional patent application claims priority under 35 U.S.C. §119 of Korean Patent Application No. 10-2015-0127749, filed on Sep. 9, 2015, the entire contents of which are hereby incorporated by reference.

BACKGROUND

The disclosure relates to a memory, and more particularly, to a memory system including a nonvolatile memory device.

A semiconductor memory device is a memory device which is embodied using a semiconductor such as silicon Si, germanium Ge, gallium arsenide GaAs, indium phosphide InP, etc. A semiconductor memory device is classified into a volatile semiconductor memory device and a nonvolatile semiconductor memory device.

A volatile memory device loses its stored data when its power supply is interrupted. Examples of the volatile memory device include a static RAM (SRAM), a dynamic RAM (DRAM), a synchronous DRAM (SDRAM), etc. A nonvolatile memory device retains its stored data even when its power supply is interrupted. Examples of the nonvolatile memory device include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

A flash memory is used in various fields because of advantages of large capacity, low noise, low power, etc. A flash memory stores data by changing threshold voltages of memory cells. As a semiconductor technology is improved these days, a MLC (multi level cell) storing at least 2 bits in one memory cell is widely used.

A feature of data stored in a memory cell is deteriorated with the lapse of time or due to a disturbance according to a read operation. Thus, to guarantee reliability of data, in the case that reliability of data is degraded below a set reference value, a flash memory performs a read reclaim operation according to a command of a memory controller. The read reclaim operation is an operation of programming data having degraded reliability into a new memory block again.

SUMMARY

Embodiments of the disclosure provide a memory system. The memory system includes a nonvolatile memory device having a first program mode and a second program mode, the second program mode programs data to have a larger read margin than the first program mode. A memory controller controls the nonvolatile memory device to program data according to the second program mode for a read reclaim operation.

Embodiments of the disclosure also provide a memory system that includes a nonvolatile memory device having a normal program mode and a reclaim program mode, the reclaim program mode programs data to have a larger read margin than the normal program mode. A memory controller detects error bits of read data readout from the nonvolatile memory device and controls the nonvolatile memory device to program the read data into a free block of the nonvolatile memory device in the reclaim program mode when the number of detected error bits exceeds a reference value.

Embodiments of the disclosure also provide a memory system having a nonvolatile memory device and a memory controller. The nonvolatile memory device includes a plurality of memory cells. The memory controller controls the nonvolatile memory device to program data within selected ones of the memory cells of the nonvolatile memory device according to each of a general programming mode and a read reclaim mode. The data programmed according to the read reclaim mode has a narrower voltage threshold distribution within the selected memory cells than data programmed according to the general programming mode.

BRIEF DESCRIPTION OF THE FIGURES

Embodiments of the disclosure will be described below in more detail with reference to the accompanying drawings. The embodiments of the disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Like numbers refer to like elements throughout.

DETAILED DESCRIPTION

Figure 1:
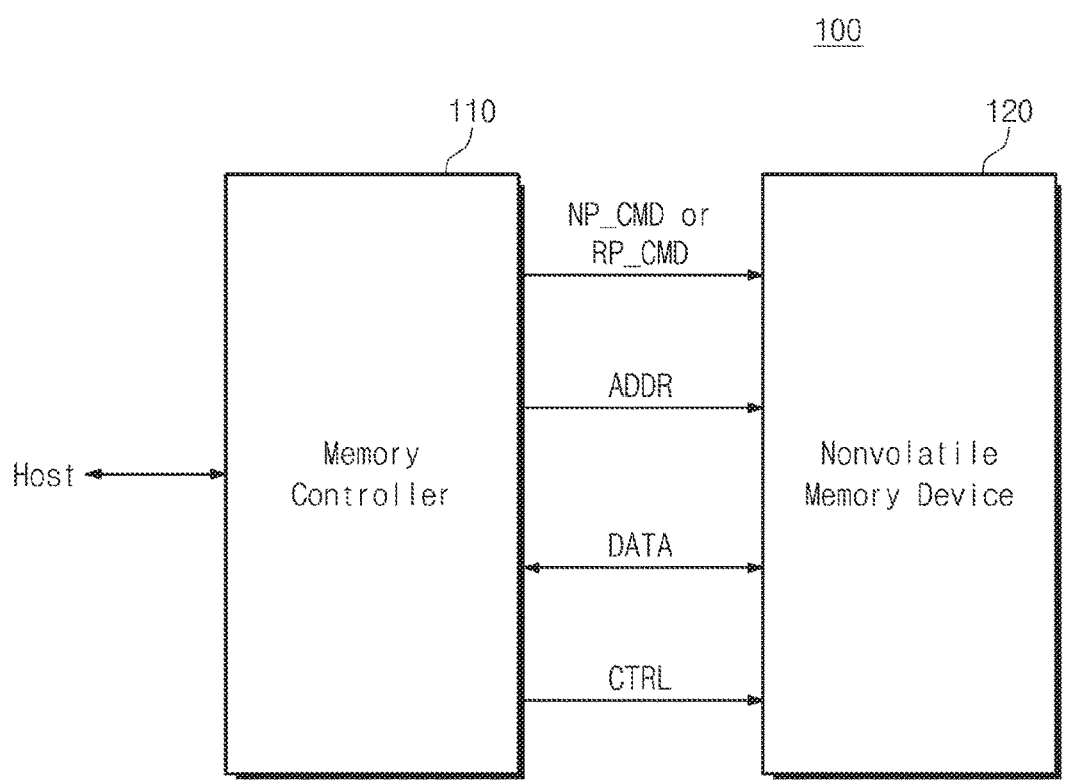
FIG. 1 is a block diagram illustrating a memory system in accordance with some embodiments of the disclosure.

Embodiments of the disclosure will be described more fully hereinafter with reference to the accompanying drawings. This disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

It will be understood that although the terms first, second, etc. may be used herein to describe various elements, components, regions, layers and/or sections, these elements, components, regions, layers and/or sections should not be limited by these terms. These terms are only used to distinguish one element from another. For example, a first region/layer could be termed a second region/layer, and, similarly, a second region/layer could be termed a first region/layer without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will also be understood that when an element such as a layer, region or substrate is referred to as being "on" or "onto" another element, it may lie directly on the other element or intervening elements or layers may also be present. It will be understood that when an element is referred to as being "connected" or "coupled" to another element, it can be directly connected or coupled to the other element or intervening elements may be present.

FIG. 1 is a block diagram illustrating a memory system in accordance with some embodiments of the disclosure. Referring to FIG. 1, a memory system 100 includes a memory controller 110 and a nonvolatile memory device 120. Each of the memory controller 110 and the nonvolatile memory device 120 may be provided as one chip, one package or one module. The memory controller 110 and the nonvolatile memory device 120 may be formed in one chip, one package or one module to be provided as a memory system such as a memory card, a memory stick, a SSD (solid state drive), etc.

The memory controller 110 may be configured to control the nonvolatile memory device 120. For example, the memory controller 110 can transmit an address ADDR, a command CMD and a control signal CTRL to the nonvolatile memory device 120 to write data DATA in the nonvolatile memory device 120 or readout data DATA stored in the nonvolatile memory device 120 according to an external request.

The nonvolatile memory device 120 can store data DATA received from the memory controller 110 or transmit stored data DATA to the memory controller 110 under the control of the memory controller 110.

The memory controller 110 can control the nonvolatile memory device 120 to perform a read reclaim operation. The read reclaim operation indicates, in the case that an amount of error included in data read from the nonvolatile memory device 120 is greater than a reference value (i.e., the number of error bits is greater than the reference value), an operation of moving all data of a memory block including memory cells storing the read data, or some data of the memory block, to another memory block. That is, the read reclaim operation is an operation of moving the data to the other memory block so as to maintain the reliability of data, which may have deteriorated so as to be read with many error bits or read with a number of error bits that is likely to exceed an error correction ability of an error correction code (ECC) circuit 115 (refer to FIG. 2). The memory controller 110, in the case that data is read from the nonvolatile memory device 120, can detect and correct an error through the ECC circuit 115 and can transmit the error-corrected data to a host (not illustrated) or the nonvolatile memory device 120. As described above, in the case that the number of error bits of the data read from the nonvolatile memory device 120 is greater than the reference value, the memory controller 110 can control the nonvolatile memory device 120 to perform a read reclaim operation.

The memory controller 110 can differently perform a program operation in accordance with a read reclaim operation and a regular program operation (hereinafter it is referred to as a normal program operation, for instance, a program operation in accordance with a program request from a host), which is not the read reclaim operation. The memory controller 110, in the case of a program operation in accordance with the read reclaim operation, can transmit a reclaim program command RP_CMD to the nonvolatile memory device 120. The memory controller 110, in the case of a program operation in accordance with the normal program operation, can transmit a normal program command NP_CMD to the nonvolatile memory device 120.

The nonvolatile memory device 120 receives the reclaim program command RP_CMD or the normal program command NP_CMD to perform a program operation corresponding to the received command. The nonvolatile memory device 120 performs a reclaim program operation in response to the reclaim program command RP_CMD. The nonvolatile memory device 120 performs a normal program operation in response to the normal program command NP_CMD. A width of a threshold voltage distribution of memory cells formed by a reclaim program operation is smaller than a width of a threshold voltage distribution of memory cells formed by a normal program operation. That is, a read margin (i.e., a threshold voltage margin) of program states formed according to a reclaim program operation is larger than a read margin (i.e., a threshold voltage margin) of program states formed according to a normal program operation. Thus, in the case of programming data according to a reclaim program operation, programmed data becomes stronger against read retention or read disturbance compared with the case of programming data according to a normal program operation. Thus, reliability of data programmed into the other memory block according to a read reclaim operation may be improved. In the case that data programmed by a read reclaim operation is hot data, an occurring period of the read reclaim operation with respect to the data may become longer. In the case that the occurring period of the read reclaim operation becomes longer, latency of the memory system 100 according to the read reclaim operation may be reduced and thereby performance of the memory system 100 may be improved.

Figure 2:
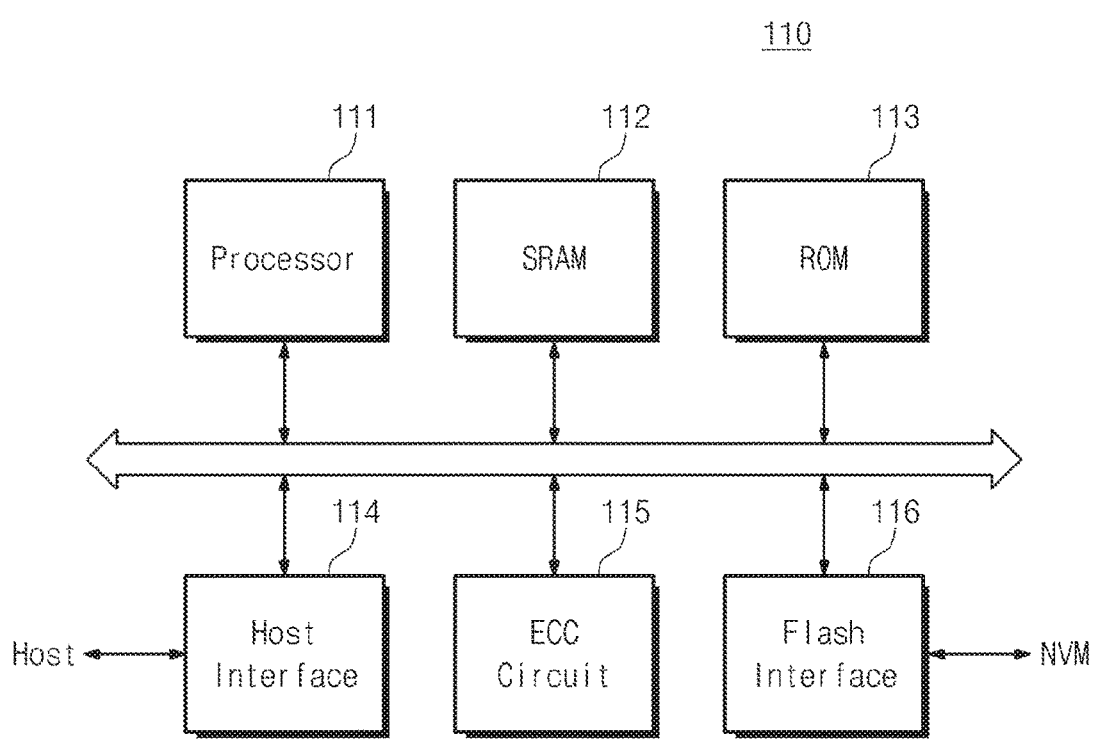
FIG. 2 is a block diagram illustrating a memory controller of FIG. 1 in detail.

FIG. 2 is a block diagram illustrating a memory controller of FIG. 1 in detail. Referring to FIG. 2, the memory controller 110 may include a processor 111, a SRAM 112, a ROM 113, a host interface 114, an ECC circuit 115, and a flash interface 116. The memory controller 110 can detect and correct an error of data read from the nonvolatile memory device 120 through the flash interface 116 using the ECC circuit 115. In the case that the number of error bits of the read data is greater than a reference value, the memory controller 110 can control the nonvolatile memory device 120 to perform the read reclaim operation.

The processor 111 can control an overall operation of the memory controller 110. The processor 111 can process various arithmetic operations being required when the memory controller 110 operates.

The SRAM 112 may be used as a buffer memory, a cache memory, an operation memory, etc. of the memory controller 110.

The ROM 113 can store varied information being required when the memory controller 110 operates in a firmware form.

The memory controller 110 can communicate with an external device (for example, a host, an application processor, etc.) through the host interface 114. The host interface 114 may include at least one of varied interfaces such as a USB (universal serial bus), a MMC (multimedia card), an eMMC (embedded MMC), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), a Firewire, a UFS (universal flash storage), etc.

The ECC circuit 115 can detect an error of data read from the nonvolatile memory device 120 and can correct the detected error. Using the number of error bits of read data detected by the ECC circuit 115, the memory controller 110 can decide whether to perform a read reclaim operation with respect to a memory block including the read data or parts of the memory block.

The memory controller 110 can communicate with the nonvolatile memory device 120 through the flash interface 116. The flash interface 116 may include a NAND interface.

Although not illustrated in the drawing, the memory controller 110 may further include a randomizer (not illustrated) that randomizes program data to be programed and a derandomizer that derandomizes data read from the nonvolatile memory device 120.

Figure 3:
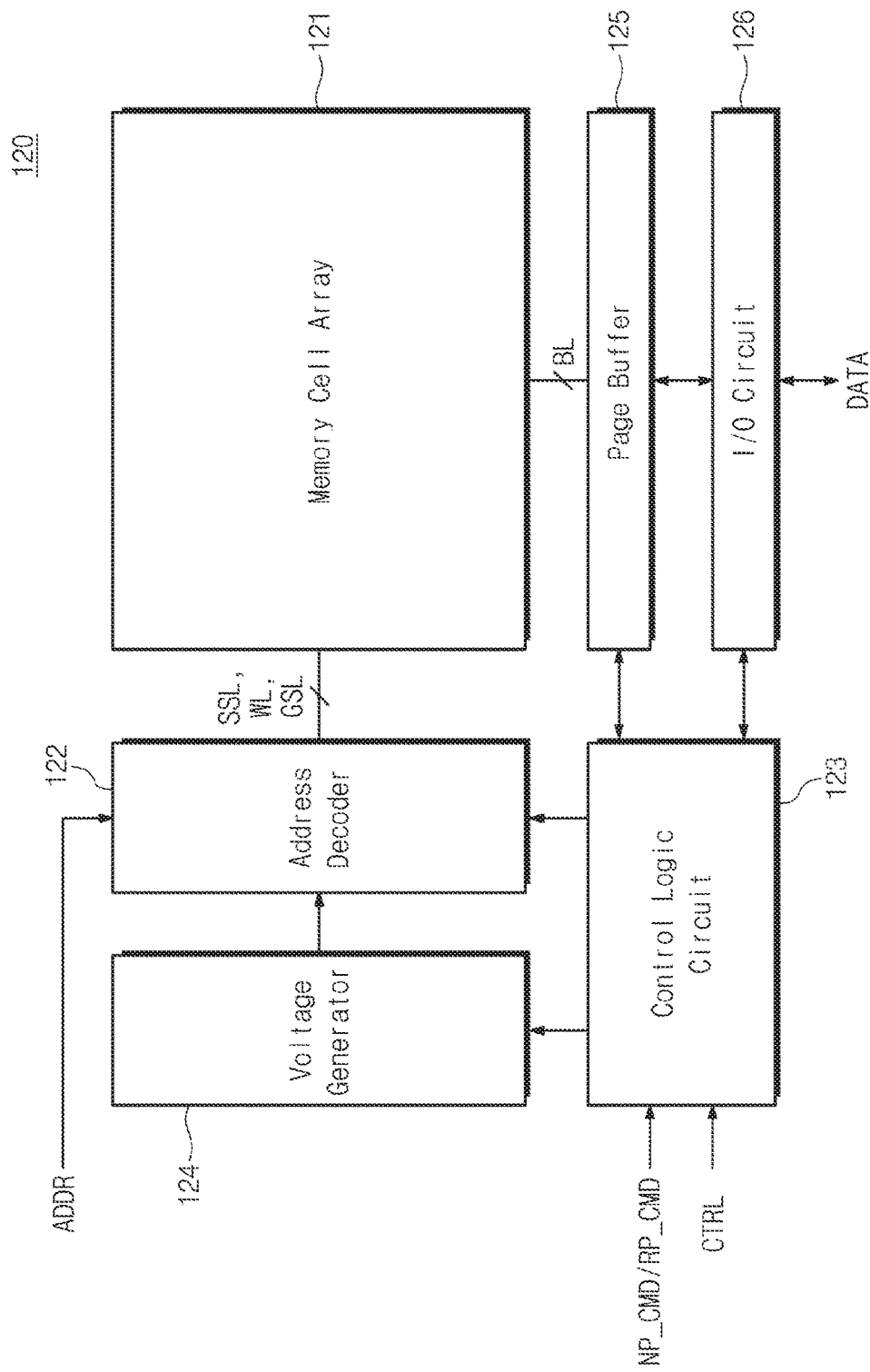
FIG. 3 is a block diagram illustrating a nonvolatile memory device in accordance with some embodiments of the disclosure.

FIG. 3 is a block diagram illustrating a nonvolatile memory device in accordance with some embodiments of the disclosure. Referring to FIG. 3, the nonvolatile memory device 120 includes a memory cell array 121, an address decoder 122, a control logic circuit 123, a voltage generator 124, a page buffer 125 and an I/O (input/output) circuit 126.

The memory cell array 121 may include a plurality of memory blocks. Each memory block may include a plurality of cell strings. Each cell string includes a plurality of memory cells. The memory cells may be connected to a plurality of word lines WL. Each memory cell may include a SLC (single level cell) storing 1 bit or a MLC (multi level cell) storing at least 2 bits.

The address decoder 122 is connected to the memory cell array 121 through string select lines SSL, the word lines WL and ground select lines GSL. The address decoder 122 receives an address ADDR from an external device (e.g., a memory controller, a host, AP, etc.) and decodes the received address ADDR to be able to drive the word lines WL. For example, the address decoder 122 decodes an address ADDR received from an external device and can select at least one word line of the word lines WL based on the decoded address ADDR. The address decoder 122 can provide a voltage (a word line voltage) received from the voltage generator 124 to a selected word line.

The control logic circuit 123 can receive a command (e.g., a normal program command NP_CMD or a reclaim program command RP_CMD) and a control signal CTRL from an external device and can control the address decoder 122, the voltage generator 124, the page buffer 125 and the I/O circuit 126 in response to the received signals. For example, the control logic circuit 123 can control other constituent elements so that data DATA is programmed into the memory cell array 121 in response to the signals NP_CMD, RP_CMD, and CTRL.

The voltage generator 124 can generate various voltages required in an operation of the nonvolatile memory device 120. For example, the voltage generator 124 can generate various voltages such as a plurality of program voltages, a plurality of pass voltages, a plurality of selected read voltages, a plurality of unselected read voltages, a plurality of erase voltages, a plurality of verify voltages, etc. The voltage generator 124 can generate a plurality of program voltages according to a control of the control logic circuit 123. The voltage generator 124 can differently control a starting amount of a program voltage, an increment, or an amount of a verify voltage with respect to a normal program operation and a reclaim program operation according to a control of the control logic circuit 123.

The page buffer 125 is connected to the memory cell array 121 through a plurality of bit lines BL. The page buffer 125 can control the bit lines BL on the basis of data received from the I/O circuit 126 under the control of the control logic circuit 123. The page buffer circuit 125 can read data stored in the memory cell array 121 and can transmit the read data to the I/O circuit 126 under the control of the control logic circuit 123. The page buffer 125 can receive data from the I/O circuit 126 by a page unit or can read data from the memory cell array 121 by a page unit.

The I/O circuit 126 can receive data DATA from an external device and can transmit the received data DATA to the page buffer 125. The I/O circuit 126 can receive data DATA from the page buffer 125 and can transmit the received data DATA to the external device. The I/O circuit 126 can transmit data to the external device and receive data from the external device in synchronization with the control signal CTRL.

Each of memory cells included in the nonvolatile memory device 120 may be a MLC storing at least 2 bits. The nonvolatile memory device 120 can program data DATA in MLCs (multi level cells) based on a multi-step program method. The nonvolatile memory device 120 can also program data DATA in MLCs (multi level cells) based on a one-shot program method. The multi-step program method indicates a method of programming a plurality of page data in memory cells connected to one word line by performing a program operation at least twice. At this time, the program operation includes a plurality of program loops. The multi-step program method may include various program methods such as a shadow program method, a reprogram method, etc. The one-shot program method indicates a method of programming a plurality of page data in memory cells connected to one word line by performing a program operation only once.

In the case that the memory cells included in the nonvolatile memory device 120 are MLCs (multi level cells) storing 2 bits, data DATA may be programmed by performing a first program operation and a second program operation. During the first program operation, the nonvolatile memory device 120 can program LSB (least significant bit)

page data corresponding to a LSB among page data to be stored in the nonvolatile memory device 120 in selected memory cells connected to a selected word line. After that, during the second program operation, the nonvolatile memory device 120 can program MSB (most significant bit) page data corresponding to a MSB among page data to be stored in the nonvolatile memory device 120 in selected memory cells (i.e., memory cells in which LSB page data is programmed) connected to a selected word line.

Figure 4:
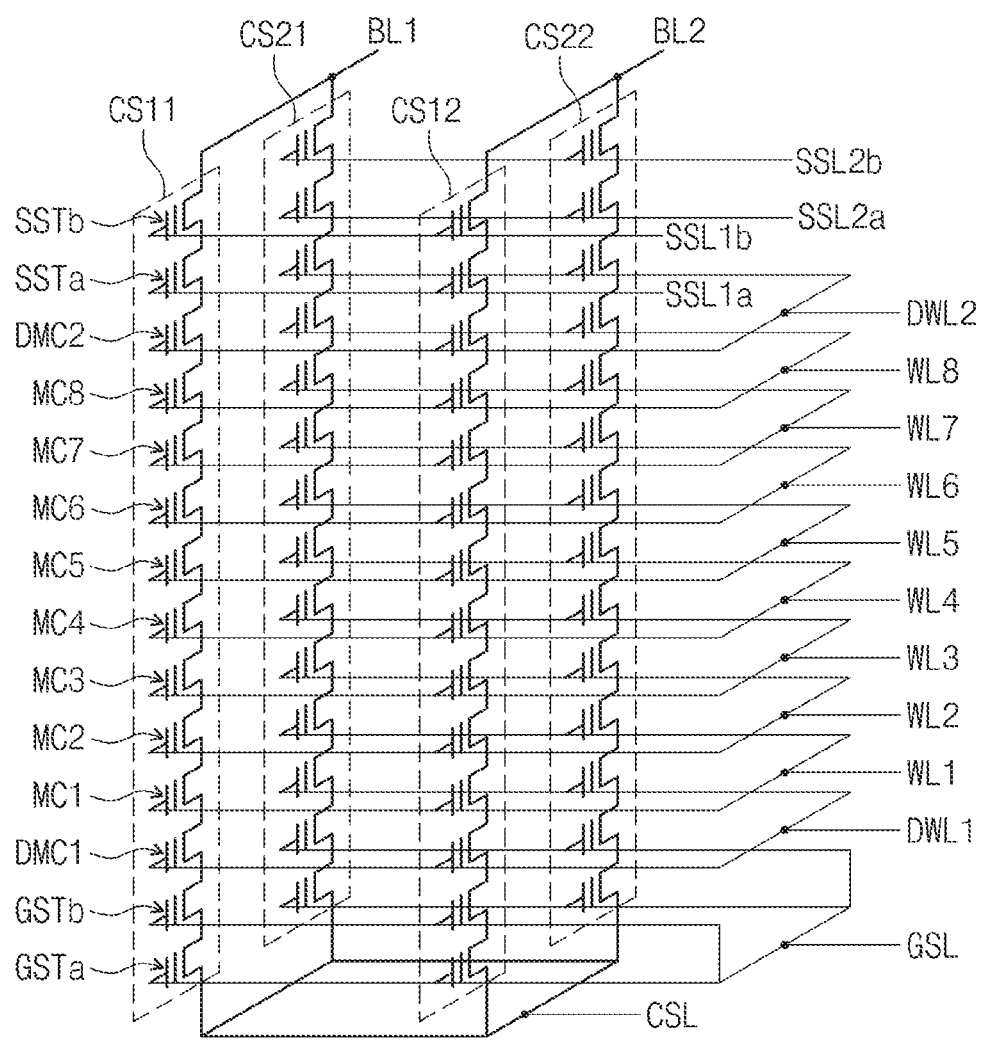
FIG. 4 is a circuit diagram illustrating an example of a memory block included in a nonvolatile memory device in accordance with some embodiments of the disclosure.
Figure 4:
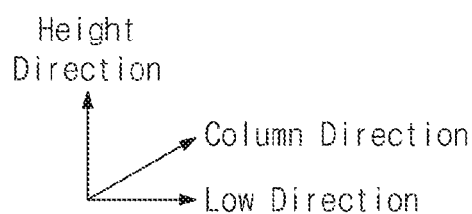

FIG. 4 is a circuit diagram illustrating an example of a memory block included in a nonvolatile memory device in accordance with some embodiments of the disclosure. A memory block BLK1 having a three-dimensional structure is described with reference to FIG. 4.

Referring to FIG. 4, the memory block BLK1 includes a plurality of cell strings (CS11, CS21, CS12, CS22). The cell strings (CS11, CS21, CS12, CS22) may be arranged along a row direction and a column direction to form rows and columns.

The cell strings (CS11, CS12) are connected to string select lines (SSL1$a$, SSL1$b$) to form a first row. The cell strings (CS21, CS22) are connected to string select lines (SSL2$a$, SSL2$b$) to form a second row.

For example, the cell strings (CS11, CS21) are connected to a first bit line BL1 to form a first column. The cell strings (CS12, CS22) are connected to a second bit line BL2 to form a second column.

Each of the cell strings (CS11, CS21, CS12, CS22) includes a plurality of cell transistors. For example, each of the cell strings (CS11, CS21, CS12, CS22) may include string select transistors (SSTa, SSTb), a plurality of memory cells (MC1~MC8), ground select transistors (GSTa, GSTb) and dummy memory cells (DMC1, DMC2).

Each of the transistors included in the cell strings (CS11, CS21, CS12, CS22) may be a CTF (charge trap flash) memory cell.

The memory cells (MC1~MC8) are serially connected to one another and are laminated in a height direction which is a direction perpendicular to a plane formed by a row direction and a column direction. The string select transistors (SSTa, SSTb) are serially connected to each other and the serially connected string select transistors (SSTa, SSTb) are provided between the memory cells (MC1~MC8) and the bit line BL. The ground select transistors (GSTa, GSTb) are serially connected to each other and the serially connected ground select transistors (GSTa, GSTb) are provided between the memory cells (MC1~MC8) and a common source line CSL.

A first dummy memory cell DMC1 may be provided between the memory cells (MC1~MC8) and the ground select transistors (GSTa, GSTb). A second dummy memory cell DMC2 may be provided between the memory cells (MC1~MC8) and the string select transistors (SSTa, SSTb).

The ground select transistors (GSTa, GSTb) of the cell strings (CS11, CS21, CS12, CS22) may be connected to a ground select line GSL in common.

Ground select transistors of the same row may be connected to the same ground select line and ground select transistors of different rows may be connected to different ground select lines. For example, the first ground select transistors GSTa of the cell strings (CS11, CS12) of the first row may be connected to a first ground select line and the first ground transistors GSTa of the cell strings (CS21, CS22) of the second row may be connected to a second ground select line.

Although not illustrated in the drawing, ground select transistors provided at the same height from a substrate (not illustrated) may be connected to the same ground select line and ground select transistors provided at different heights may be connected to different ground select lines. For example, the first ground transistors GSTa of the cell strings (CS11, CS21, CS12, CS22) may be connected to the first ground select line and the second ground transistors GSTb of the cell strings (CS11, CS21, CS12, CS22) may be connected to the second ground select line.

Memory cells of the same height from the substrate (or the ground select transistors (GSTa, GSTb)) are connected to the same word line in common and memory cells of different heights are connected to different word lines. For example, the first through eighth memory cells (MC1~MC8) of the cell strings (CS11, CS21, CS12, CS22) are connected to the first through eighth word lines (WL1~WL8) respectively in common.

String select transistors of the same row among the first string select transistors SSTa of the same height are connected to the same string select line and string select transistors of different rows are connected to different string select lines. For example, the first string select transistors SSTa of the cell strings (CS11, CS12) of the first row are connected to the string select line SSL1$a$ in common and the first string select transistors SSTa of the cell strings (CS21, CS22) of the second row are connected to the string select line SSL2$a$ in common, Similarly, string select transistors of the same row among the second string select transistors SSTb of the same height are connected to the same string select line and string select transistors of different rows are connected to different string select lines. For example, the second string select transistors SSTb of the cell strings (CS11, CS12) of the first row are connected to the string select line SSL1$b$ in common and the second string select transistors SSTb of the cell strings (CS21, CS22) of the second row are connected to the string select line SSL2$b$ in common.

Although not illustrated in the drawing, string select transistors of cell strings of the same row may be connected to the same string select line in common. For example, the first and second string select transistors (SSTa, SSTb) of the cell strings (CS11, CS12) of the first row may be connected to the same string select line in common. The first and second string select transistors (SSTa, SSTb) of the cell strings (CS21, CS22) of the second row may be connected to the same string select line in common.

Dummy memory cells of the same height are connected to the same dummy word line and dummy memory cells of different heights are connected to different dummy word lines respectively. For example, the first dummy memory cell DMC1 is connected to a first dummy word line DWL1 and the second dummy memory cells DMC2 are connected to a second dummy word line DWL2.

In the memory block BLK1, read and write operations may be performed by a row unit. For example, one row of the memory block BLK1 may be selected by string select lines (SSL1$a$, SSL1$b$, SSL2$a$, SSL2$b$).

For example, when a turn-on voltage is supplied to the string select lines (SSL1$a$, SSL1$b$) and a turn-off voltage is supplied to the string select lines (SSL2$a$, SSL2$b$), the cell strings (CS11, CS12) of the first row are connected to the bit lines (BL1, BL2) to be driven. When a turn-on voltage is supplied to the string select lines (SSL2$a$, SSL2$b$) and a turn-off voltage is supplied to the string select lines (SSL1$a$, SSL1$b$), the cell strings (CS21, CS22) of the second row are connected to the bit lines (BL1, BL2) to be driven. Memory cells of the same height are selected from among memory cells of the cell strings of a row being driven by driving a word line. Read and write operations may be performed on the selected memory cells. The selected memory cells may form a physical page unit.

In the memory block BLK1, an erase operation may be performed by a memory block unit or a sub block. When an erase operation is performed by a memory block unit, all the memory cells MC of the memory block BLK1 may be erased at the same time according to an erase request. When an erase operation is performed by a sub block unit, parts of the memory cells MC of the memory block BLK1 may be erased at the same time according to an erase request and the remaining parts of the memory cells MC may be erase-prohibited. A low voltage (for example, a ground voltage) may be supplied to a word line connected to the memory cells MC being erased and a word line connected to the erase-prohibited memory cells MC may be floated.

The memory block BLK1 illustrated in FIG. 4 is illustrative. The number of cell strings may increase or decrease, and the number of rows and columns constituted by cell strings may increase or decrease depending on the number of the cell strings. Also, the number of the cell transistors (GST, MC, DMC, SST) of the memory block BLK1 may increase or decrease, and a height of the memory block BLK1 may increase or decrease depending on the number of the cell transistors (GST, MC, DMC, SST). The number of the lines (GSL, WL, DWL, SSL) connected to the cell transistors (GST, MC, DMC, SST) may increase or decrease depending on the number of the cell transistors (GST, MC, DMC, SST).

On the basis of the one-shot program method or the multi-step program method, the nonvolatile memory device 120 can program data in the memory block BLK1 by the normal program operation or the reclaim program operation. At this time, a width of a threshold voltage distribution formed by the reclaim program operation may be smaller than a width of a threshold voltage distribution formed by the normal program operation. That is, a shape of the threshold voltage distribution formed by the reclaim program operation may be formed to be sharper than a shape of the threshold voltage distribution formed by the normal program operation.

Figure 5:
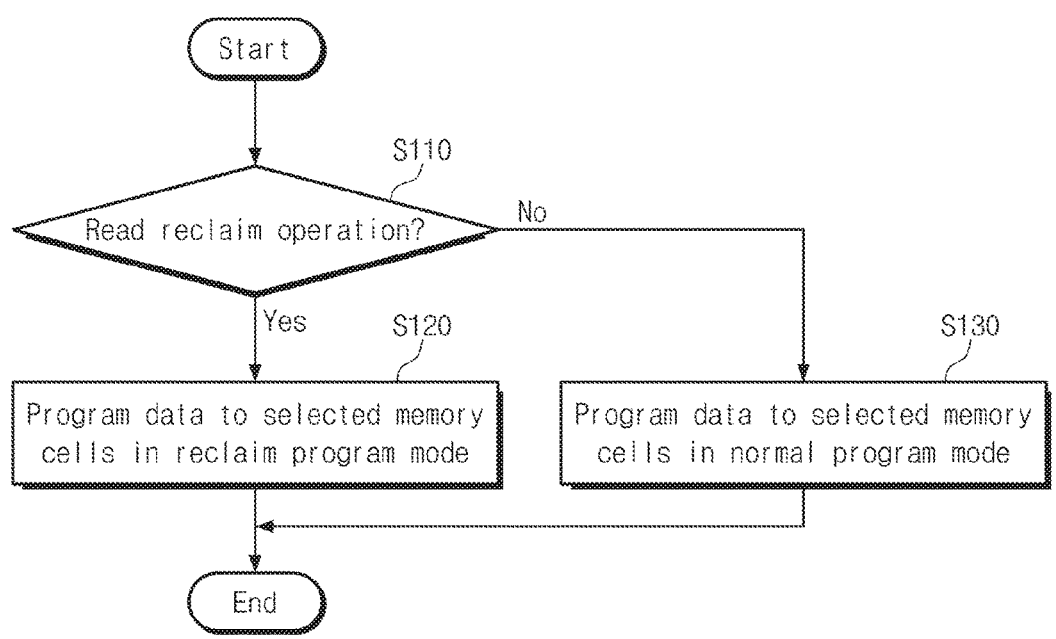
FIG. 5 is a flowchart illustrating a program concept of a memory system in accordance with some embodiments of the disclosure.

FIG. 5 is a flowchart illustrating a program concept of a memory system in accordance with some embodiments of the disclosure. The memory system 100 (refer to FIG. 1) can program data in the nonvolatile memory device 120 (refer to FIG. 1) using two program modes, depending on the situation.

In an operation S110, the memory controller 110 (refer to FIG. 1) checks whether a program operation with respect to the nonvolatile memory device 120 is a read reclaim operation. As time goes by, reliability of data stored in memory cells is degraded due to a retention characteristic or a read disturbance phenomenon. Thus, the memory controller 110 can perform a read reclaim operation of programming stored data in a new memory block before the reliability of the stored data is degraded beyond an error correction ability of the ECC circuit (refer to FIG. 2). Since the read reclaim operation is accompanied with a program operation, the memory controller 110 checks whether a program operation with respect to the nonvolatile memory device 120 is a program operation according to the read reclaim operation.

In the case that the program operation is a program operation according to the read reclaim operation, the procedure goes to an operation S120.

In the operation S120, the nonvolatile memory device 120 receives a reclaim program command RP_CMD from the memory controller 110 to perform a reclaim program operation corresponding to the reclaim program command RP_CMD. That is, a program operation with respect to data is performed in a reclaim program mode.

In the case that the program operation is not a program operation according to the read reclaim operation, the procedure goes to an operation S130.

In the operation S130, the nonvolatile memory device 120 receives a normal program command NP_CMD from the memory controller 110 to perform a normal program operation corresponding to the normal program command NP_CMD. That is, a program operation with respect to data is performed in a normal program mode.

Here, a width of a threshold voltage distribution formed by the program operation according to the reclaim program mode may be smaller than a width of a threshold voltage distribution formed by the program operation according to the normal program mode. That is, a threshold voltage margin between any one program state formed by the reclaim program operation and a program state adjacent to the program state is larger than a threshold voltage margin according to the normal program operation. Thus, reliability of data programmed according to the read reclaim operation is higher than reliability of data programmed according to the normal reclaim operation. That is, the data programmed by the read reclaim operation has an improved retention characteristic and has a stronger characteristic against a read disturbance.

In the case that data that moves to a new memory block according to the read reclaim operation is hot data, an increase of reliability as a consequence of the read reclaim operation can reduce an occurrence frequency of the read reclaim operation. Thus, an increase of a WAF (write amplification factor) may be reduced and a reduction of latency caused by frequent read reclaim operations may be reduced, and thereby performance of the memory system 100 may be improved.

Figure 6:
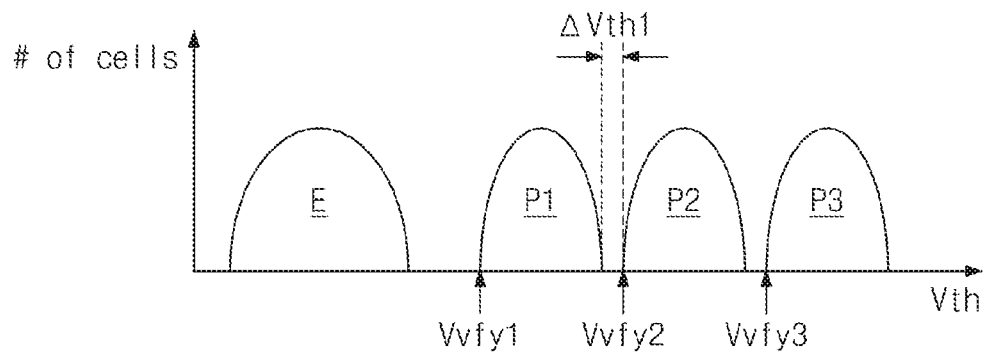
FIG. 6 is a drawing illustrating a threshold voltage distribution of a final program state in accordance with a normal program operation and a reclaim program operation according to the disclosure.
Figure 6:
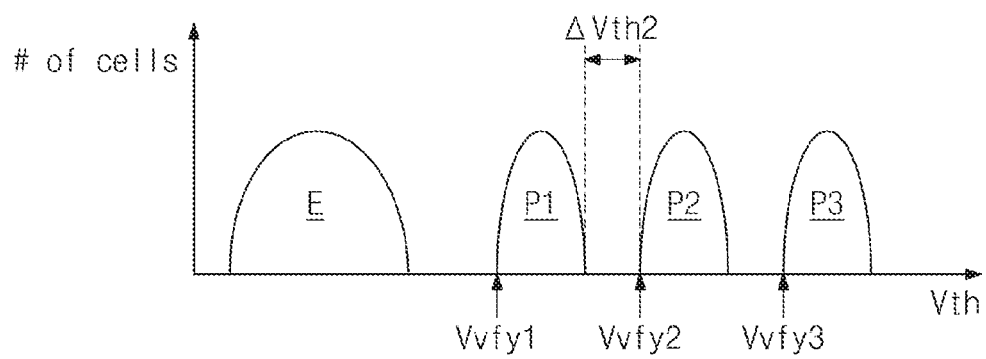

FIG. 6 is a drawing illustrating a threshold voltage distribution of a final program state in accordance with a normal program operation and a reclaim program operation according to the disclosure. Referring to FIG. 6, it is illustrated that 2-bit data is programmed per memory cell. However, the disclosure is not limited thereto, 3-bit data or 4-bit data may be programmed per memory cell.

A threshold voltage distribution formed by a normal program operation is illustrated in an upper portion of FIG. 6 and a threshold voltage distribution formed by a reclaim program operation is illustrated in a lower portion of FIG. 6. Here, the normal program operation means all program operations of the memory system 100 (refer to FIG. 1) except program operations according to the read reclaim operation. For instance, the normal program operation may be a program operation according to a program request from a host (not illustrated), a program operation according to a garbage collection operation, etc.

Referring to FIG. 6, a width of a threshold voltage distribution formed according to the reclaim program operation is smaller than a width of a threshold voltage distribution formed according to the normal program operation. That is, the threshold voltage distribution formed according to the reclaim program operation is denser than the threshold voltage distribution formed according to the normal program operation. A read margin among program states according to the normal program operation, for example, a read margin between a first program state P1 and a second program state P2, is as much as $\Delta Vth1$. According to the reclaim program operation, a read margin between the first program state P1 and the second program state P2 is as much as $\Delta Vth2$. Here, ΔVth2 is greater than ΔVth1. That is, the read margin according to the reclaim program operation is larger than the read margin according to the normal program operation. Thus, a retention characteristic and a read disturbance characteristic of a memory cell programmed according to the reclaim program operation may be improved. There is consequently an effect that reliability of data programmed according to the reclaim program operation is improved compared with reliability of data programmed according to the normal program operation.

Program operations that will be described below may be performed according to an ISPP (incremental step pulse programming) technique in which a program voltage increases by a fixed increment when a program loop is repeated.

Figure 7A:
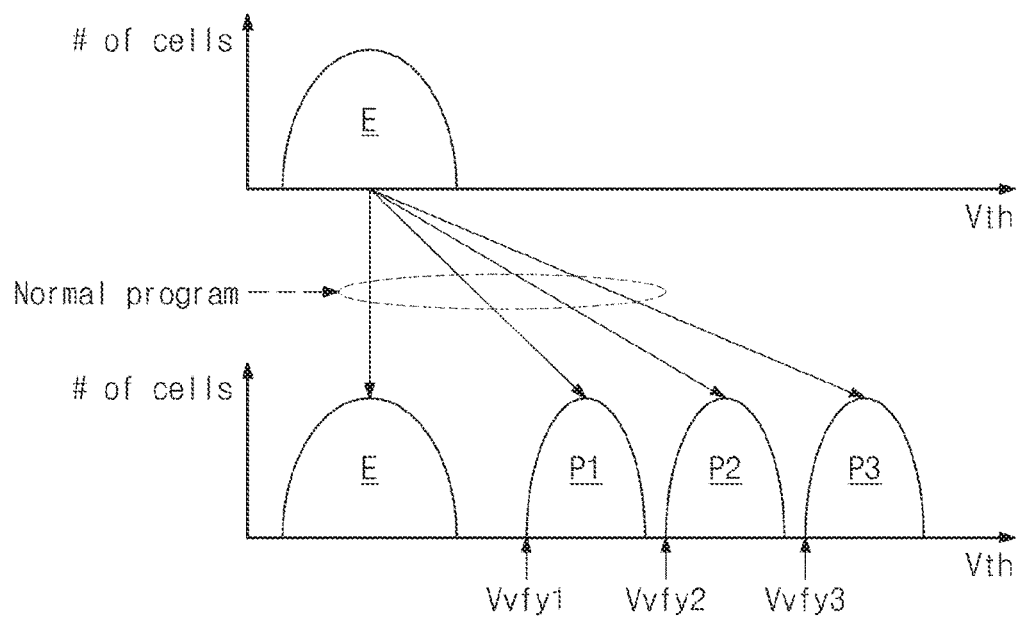
FIG. 7A is a drawing illustrating a normal program operation in accordance with some embodiments of the disclosure.
Figure 7B:
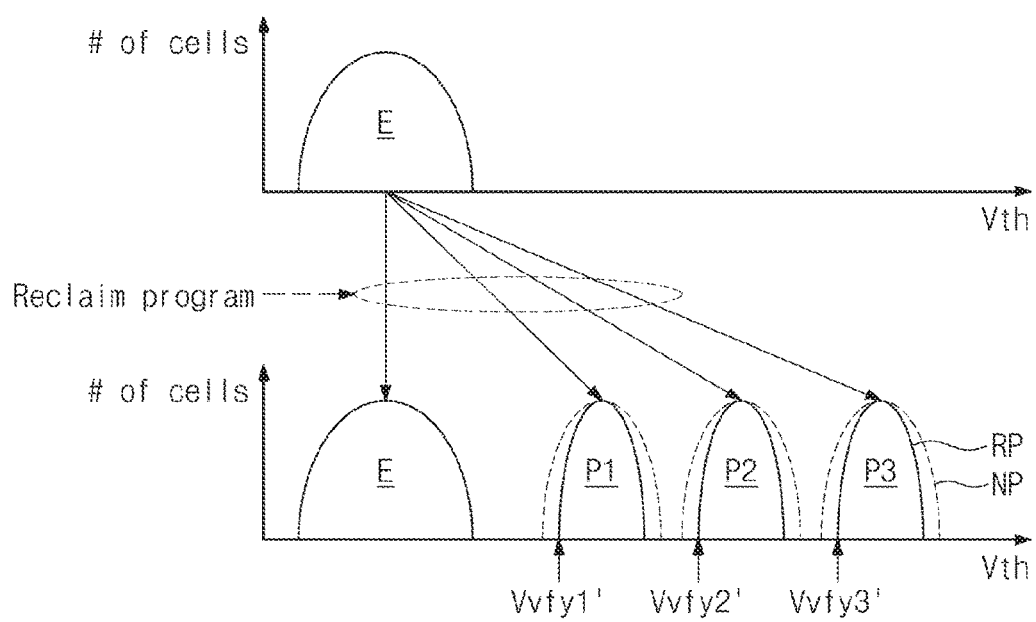
FIG. 7B is a drawing illustrating a reclaim program operation in accordance with some embodiments of the disclosure.
Figure 8:
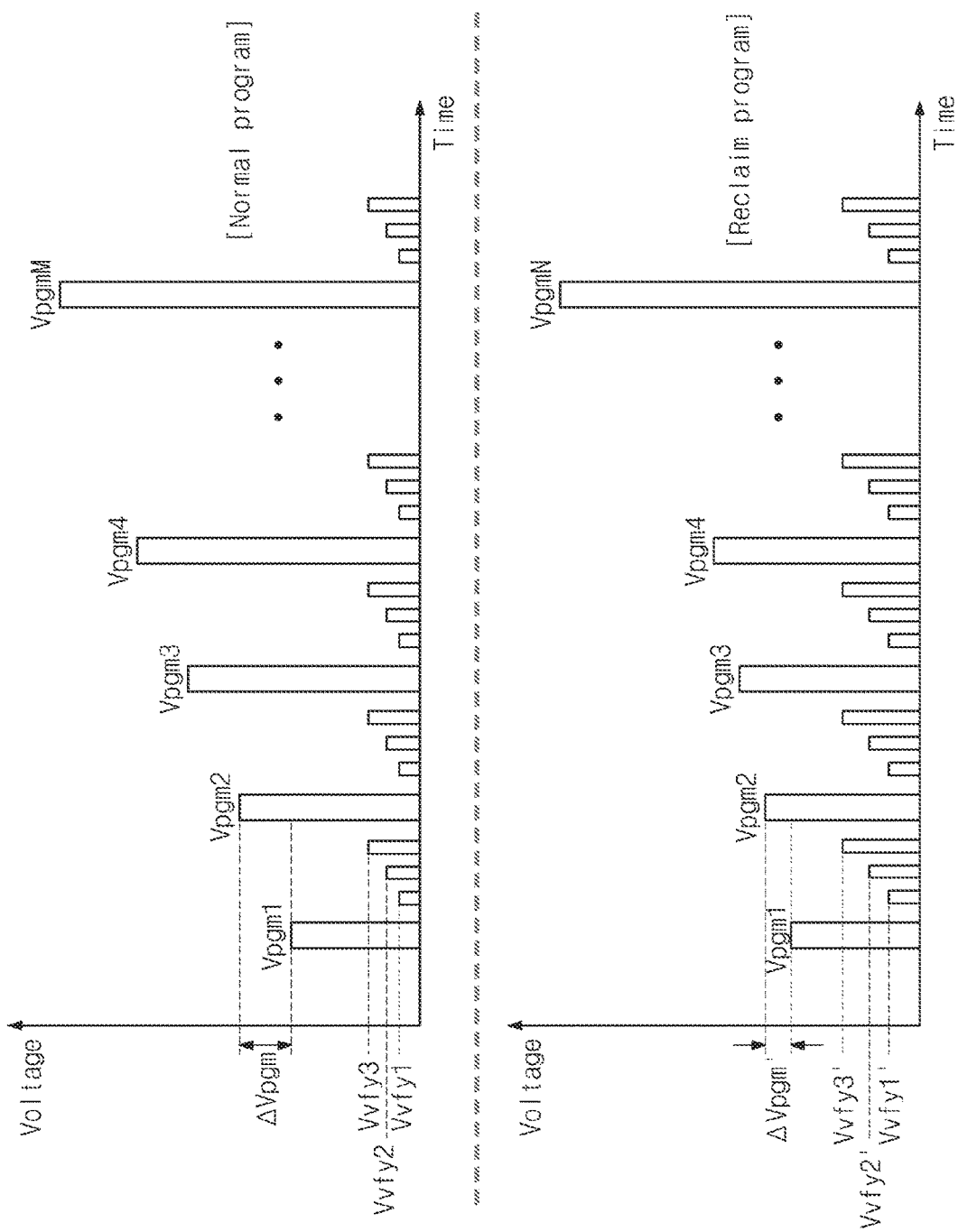
FIG. 8 is a drawing illustrating a program voltage and a verify voltage being applied to a selected word line according to the program operations of FIG. 7A and FIG. 7B.

FIG. 7A is a drawing illustrating a normal program operation in accordance with some embodiments of the disclosure. FIG. 7B is a drawing illustrating a reclaim program operation in accordance with some embodiments of the disclosure. FIG. 8 is a drawing illustrating a program voltage and a verify voltage being applied to a selected word line according to program operations of FIG. 7A and FIG. 7B. The normal program operation and the reclaim program operation in accordance with some embodiments of the disclosure are described in further detail with reference to FIGS. 7A, 7B and 8.

FIG. 7A and FIG. 7B illustrate a one-shot program method in which multi-bit data is programmed into one memory cell according to one program cycle.

In FIG. 7A and FIG. 7B, all memory cells have threshold voltages corresponding to an erase state E before being programmed Selected memory cells may have threshold voltages corresponding to the erase state E, as achieved through an erase operation. Thereafter, the nonvolatile memory device 120 (refer to FIG. 1) may receive a normal program command NP_CMD or a reclaim program command RP_CMD from the memory controller 110 (refer to FIG. 1) to perform a program operation corresponding to each command.

Since the program operations illustrated in FIG. 7A and FIG. 7B are one-shot program method, multi-bit data, for instance, 2-bit data is programmed into the selected memory cells during one program cycle. The one program cycle, as illustrated in FIG. 8, is comprised of a plurality of increasing program voltages (Vpgm1~VpgmM, Vpgm1~VpgmN) and verify voltages (Vvfy1~Vvfy3, Vvfy1'~Vvfy3') corresponding to each of target states (P1, P2, P3) subsequent to each of the program voltages (Vpgm1~VpgmM, Vpgm1~VpgmN).

A shape of a threshold voltage distribution formed by the normal program operation is different from a shape of a threshold voltage distribution formed by the reclaim program operation. That is, the shape of a threshold voltage distribution (RP) formed by the reclaim program operation is sharper than the shape of a threshold voltage distribution (NP) formed by the normal program operation. Thus, the verify voltage and an increment of the program voltage according to the normal program operation may be different from the verify voltage and an increment of the program voltage according to the reclaim program operation.

The verify voltage Vvfy1' of the same program state, for instance, the program state P1 illustrated in FIG. 7B may be greater than the verify voltage Vvfy1 of the program state P1 illustrated in FIG. 7A. To form a threshold voltage distribution more densely, an increment Δ Vpgm' of the program voltage of FIG. 7B may be smaller as compared with an increment Δ Vpgm of the program voltage of FIG. 7A.

Although not illustrated in the drawings, an increment of a program voltage being applied to a word line selected according to the reclaim program operation may be changed during a program loop. For instance, the increment of the program voltage is changed to become smaller than the previous increment as the program loop proceeds. In the case that the increment of the program voltage is changed to become smaller than the previous increment as the program loop proceeds, a completion time of the reclaim program operation may be shortened compared with the case that the increment of the program voltage is not changed.

In the case of applying the program voltages and the verify voltages illustrated in FIG. 8 to a selected word line, a final threshold voltage distribution according to the normal program operation and a final threshold voltage distribution according to the reclaim program operation may be formed with the shape illustrated in FIG. 6. That is, a width of the threshold voltage distribution according to the reclaim program operation may be formed smaller than a width of the threshold voltage distribution according to the normal program operation. In the case of the reclaim program operation, a read margin among adjacent program states increases and thereby reliability of data may be improved compared with the normal program operation.

Figure 9A:
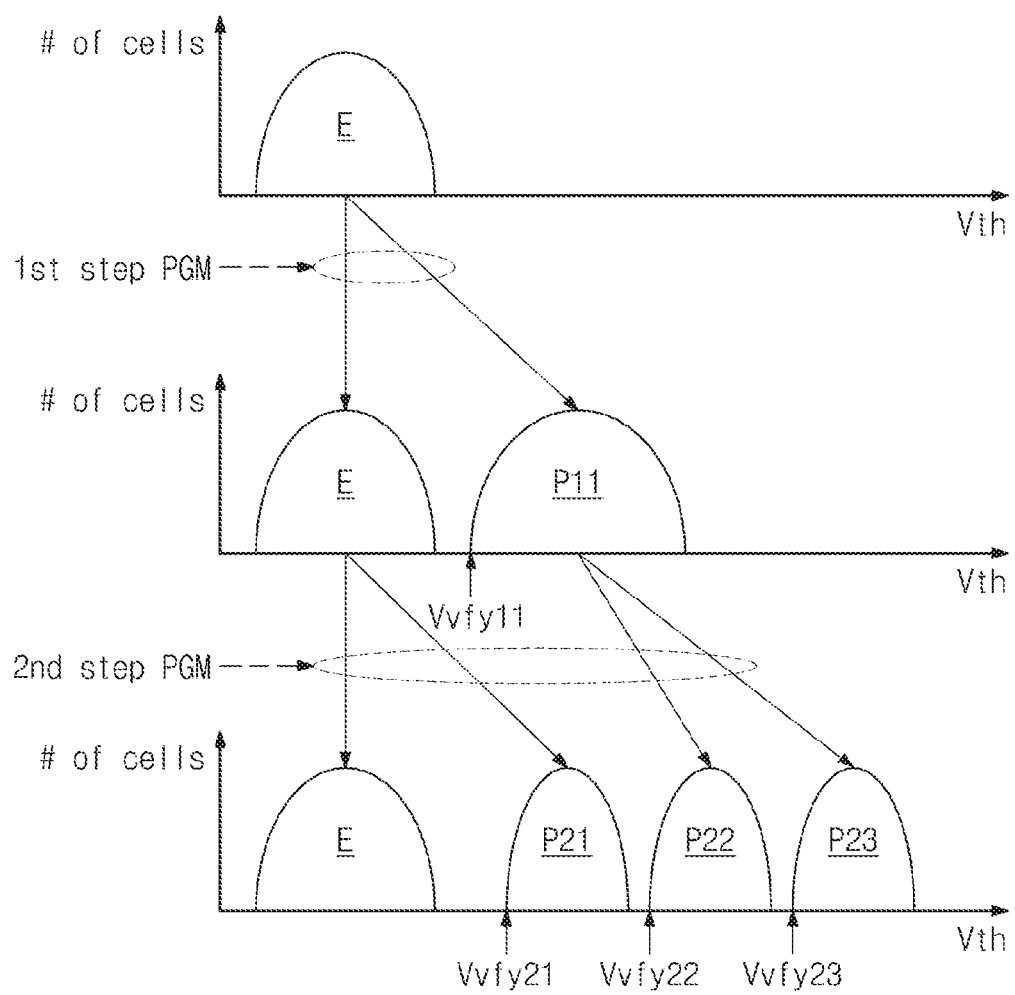
FIG. 9A is a drawing illustrating a normal program operation in accordance with some other embodiments of the disclosure.
Figure 9B:
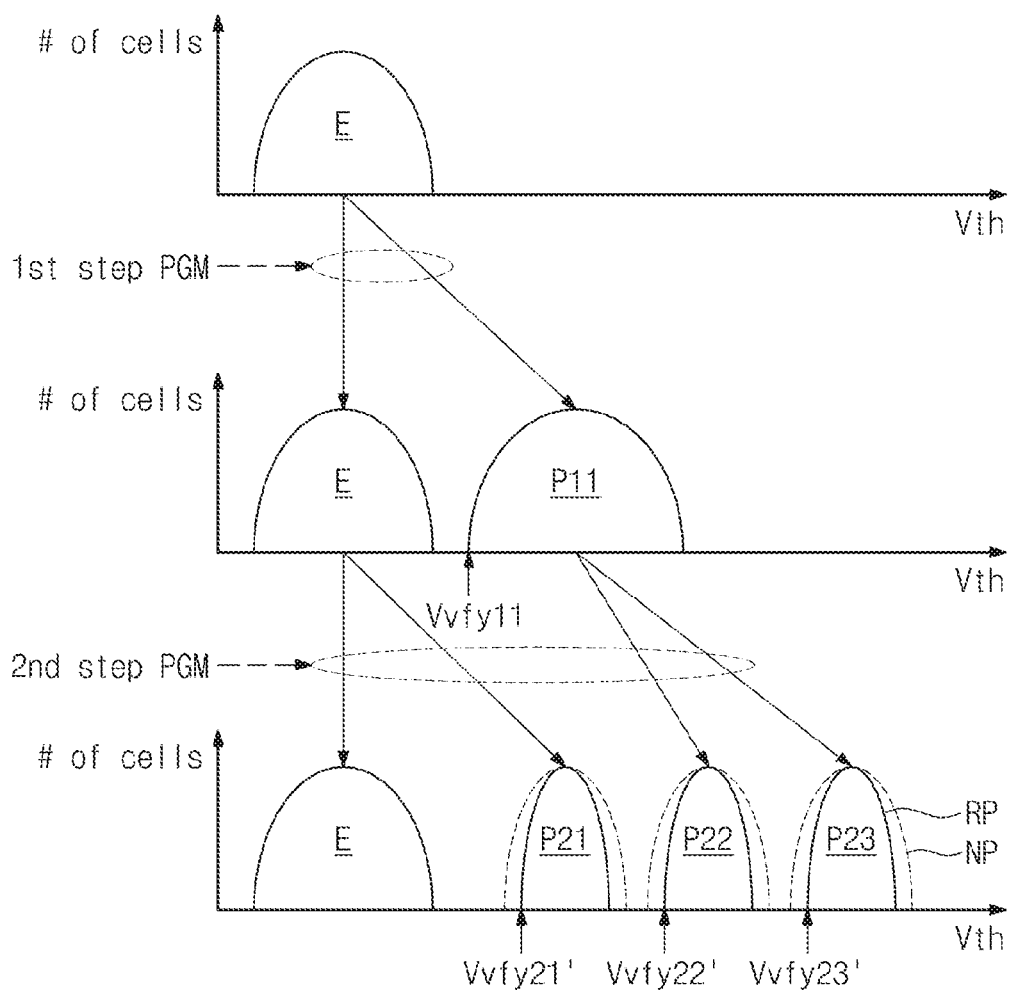
FIG. 9B is a drawing illustrating a reclaim program operation in accordance with some other embodiments of the disclosure.
Figure 10:
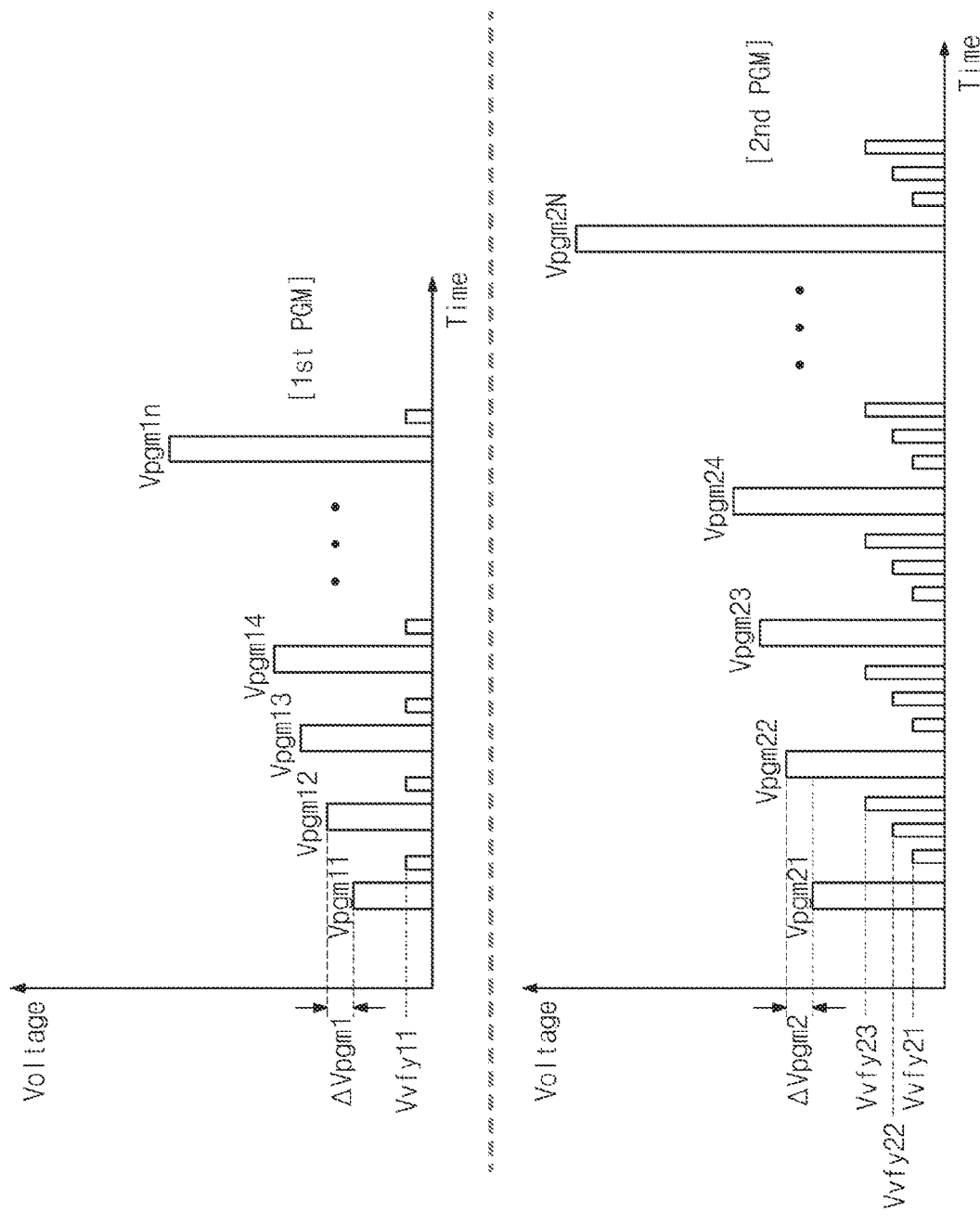
FIG. 10 is a drawing illustrating a program voltage and a verify voltage being applied to a selected word line according to the program operations of FIG. 9A and FIG. 9B.

FIG. 9A is a drawing illustrating a normal program operation in accordance with some other embodiments of the disclosure. FIG. 9B is a drawing illustrating a reclaim program operation in accordance with some other embodiments of the disclosure. FIG. 10 is a drawing illustrating a program voltage and a verify voltage being applied to a selected word line according to the program operations of FIG. 9A and FIG. 9B. The normal program operation and the reclaim program operation in accordance with some embodiments of the disclosure will be described with reference to FIGS. 9A, 9B and 10 in further detail.

FIGS. 9A and 9B illustrate a multi-step program method in which multi-bit data is programmed into one memory cell according to two program cycles.

In FIGS. 9A and 9B, all memory cells have a threshold voltage corresponding to an erase state E before being programmed Selected memory cells may all have a threshold voltage corresponding to the erase state E, as achieved through an erase operation. After that, the nonvolatile memory device 120 (refer to FIG. 1) may receive a normal program command NP_CMD or a reclaim program command RP_CMD from the memory controller 110 (refer to FIG. 1) to perform a program operation corresponding to each command.

The program operation illustrated in FIGS. 9A and 9B is a multi-step program method and includes a first program step and a second program step. Memory cells selected in the first program step may be programmed to have two program states (E, P11). Memory cells selected in the second program step may be programmed to have, finally, four program states (E, P21, P22, P23). That is, FIGS. 9A and 9B illustrate an operation in which 2-bit data is programmed per memory cell.

A threshold voltage distribution of each program state finally formed according to the reclaim program operation illustrated in FIG. 9B is formed to be narrower than a threshold voltage distribution of each program state finally formed according to the normal program operation illustrated in FIG. 9A.

Thus, in FIG. 10, increments (ΔVpgm1, ΔVpgm2) of program voltages and amplitudes (Vvfy11, Vvfy21, Vvfy22, Vvfy23) of verify voltages that are applied to a selected word line in each program step may be different in the normal program operation and the reclaim program operation respectively. For example, in the second program step, an increment (ΔVpgm2) of a program voltage being applied according to the reclaim program operation may be smaller than an increment (ΔVpgm2) of a program voltage being applied according to the normal program operation. In the second program step, amplitudes (Vvfy21', Vvfy22', Vvfy23') of verify voltages being applied according to the reclaim program operation may be greater than amplitudes (Vvfy21, Vvfy22, Vvfy23) of verify voltages being applied according to the normal program operation.

Thus, a threshold voltage distribution (RP) finally formed by the reclaim program operation may be denser than a threshold voltage distribution (NP) finally formed by the normal program operation. That is, a read margin of data programmed according to the reclaim program operation may be larger than a read margin of data programmed according to the normal program operation. This brings about the improvement of retention characteristic and read disturbance of the programmed data. As a result, reliability of the data programmed according to the reclaim program operation becomes higher as compared with that of the data programmed according to the normal program operation. Thus, a period in which data programmed by a read reclaim operation is programmed by the read reclaim operation again may become longer, thereby reducing an increase of a WAF (write amplification factor). As a result, a lifespan of the memory system 100 (refer to FIG. 1) may be improved. Also, a period in which a read claim operation with respect to the same data is performed becomes longer and thereby performance degradation of the memory system 100 due to an increase of latency, due to frequent read reclaim operations, may be reduced.

Figure 11:
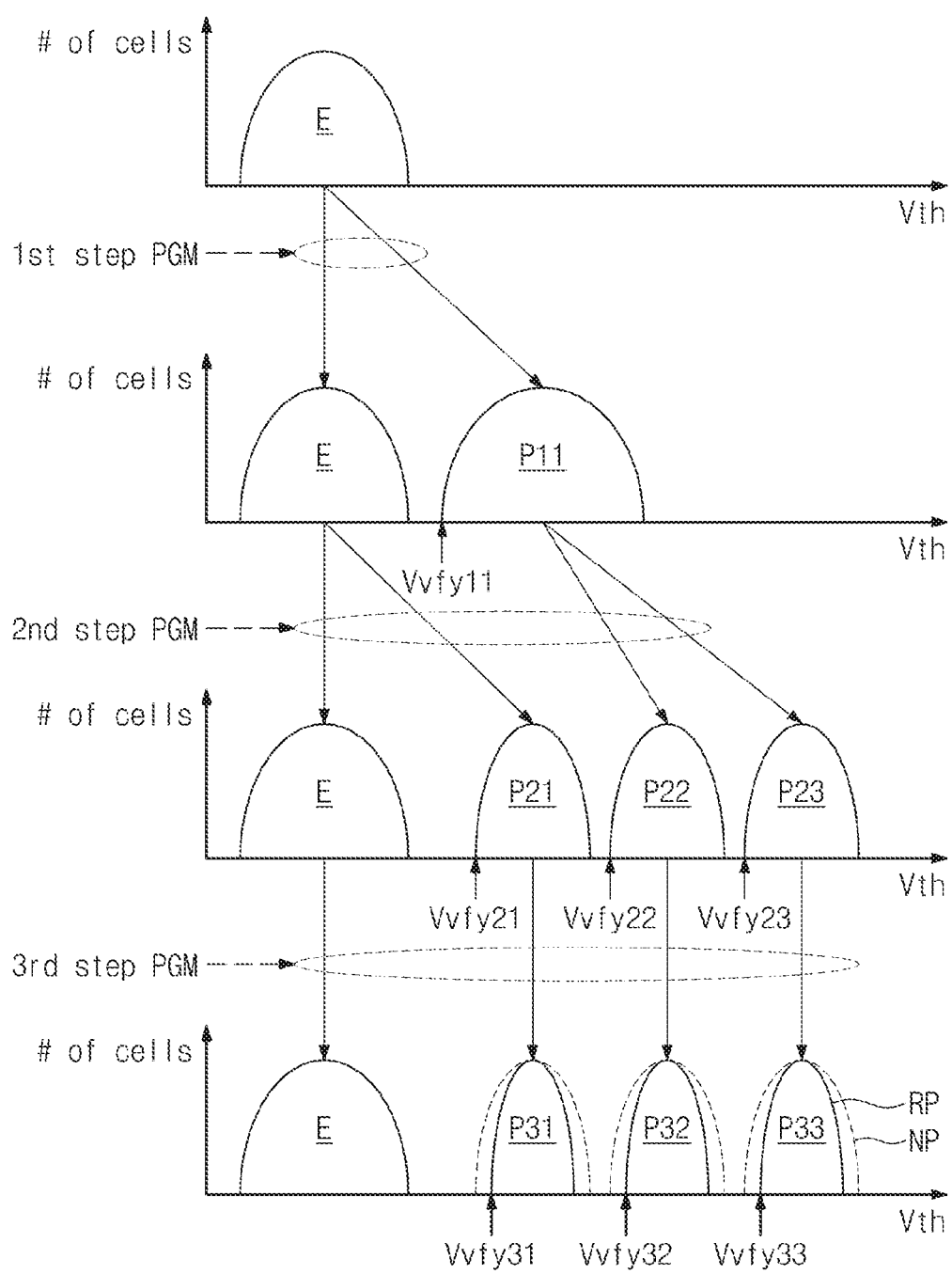
FIG. 11 is a drawing illustrating a reclaim program operation in accordance with some other embodiments of the disclosure.
Figure 12:
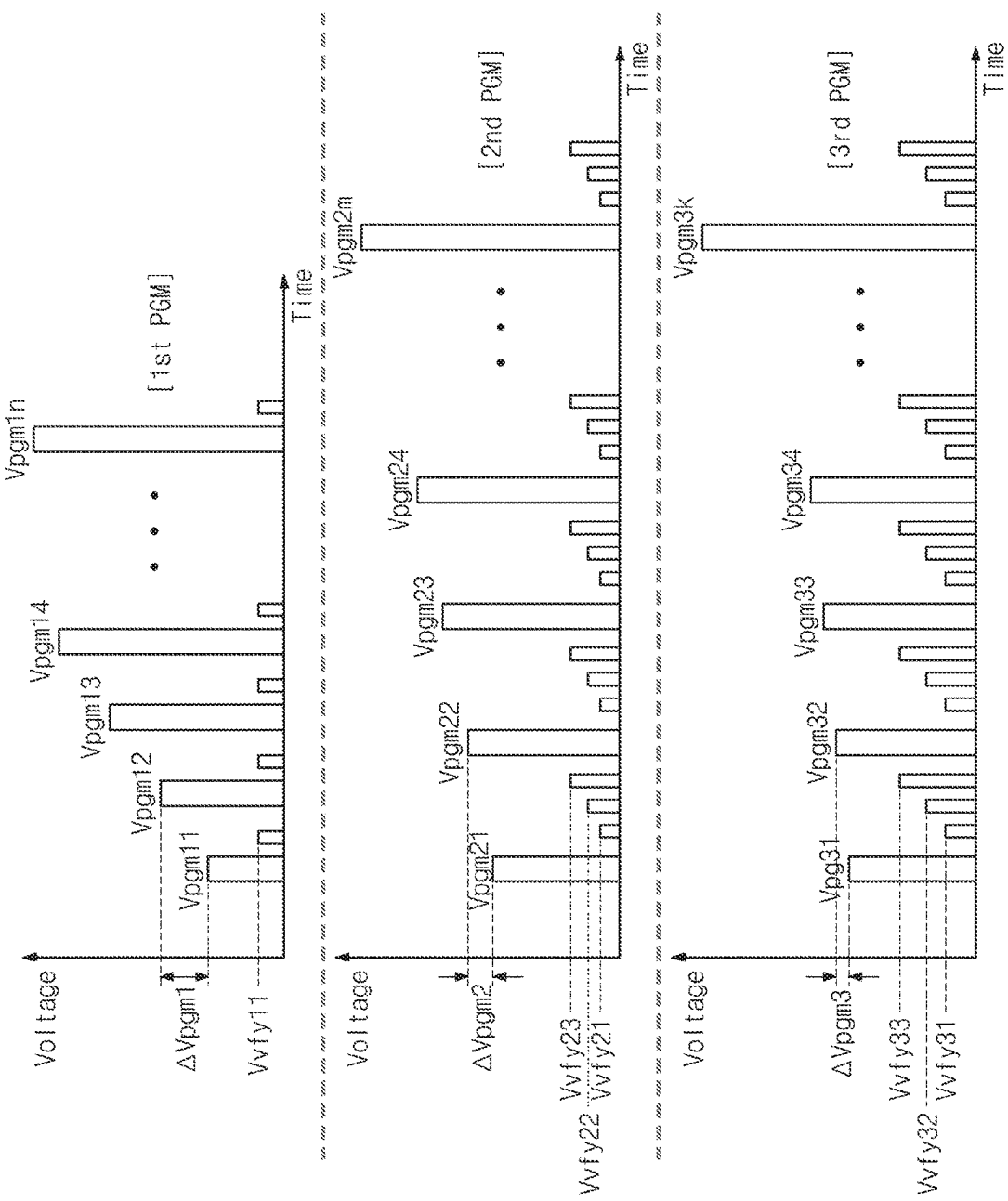
FIG. 12 is a drawing illustrating a program voltage and a verify voltage being applied to a selected word line according to the program operation of FIG. 11.

FIG. 11 is a drawing illustrating a reclaim program operation in accordance with some other embodiments of the disclosure. FIG. 12 is a drawing illustrating a program voltage and a verify voltage being applied to a selected word line according to the program operations of FIG. 11.

Referring to FIG. 11, the reclaim program operation includes three program steps. A first program step and a second program step may be the same as the respective program steps according to the normal program operation illustrated in FIG. 9A. That is, the reclaim program operation according to FIG. 11 further includes a third program step to more densely form a threshold voltage distribution formed by the normal program operation illustrated in FIG. 9A.

In the third program step, data is programmed so that a threshold voltage distribution corresponding to program states (P21, P22, P23) formed in the second program step becomes narrower. Thus, amplitudes of verify voltages (Vvfy31, Vvfy32, Vvfy33) applied to a word line selected in the third program step are greater than amplitudes of verifies (Vvfy21, Vvfy22, Vvfy23) applied to a word line selected in the second program step. Also, an increment (ΔVpgm3) of a program voltage applied to a word line selected in the third program step is smaller than an increment (ΔVpgm2) of a program voltage applied to a word line selected in the second program step.

In the description of FIGS. 11 and 12, the first program step and the second program step are described to be the same as the respective program steps according to the normal program operation illustrated in FIG. 9A. However, the first program step and the second program step may have threshold voltage distributions different from those in the respective program steps of FIG. 9A. This can be implemented by changing a starting amount of a program voltage, an increment of a program voltage, and an amplitude of a verify voltage. The reclaim program operation of the disclosure programs data so that a width of a final threshold voltage distribution of memory cells formed according to the reclaim program operation is narrower (i.e., more dense) than a width of a final threshold voltage distribution of memory cells finally formed according to the normal program operation. Thus, the reclaim program operation may include any program operation that programs data to have a different read margin (i.e., a larger read margin) than a threshold voltage distribution formed by the normal program operation, regardless of a specific method of achieving the programming.

Figure 13:
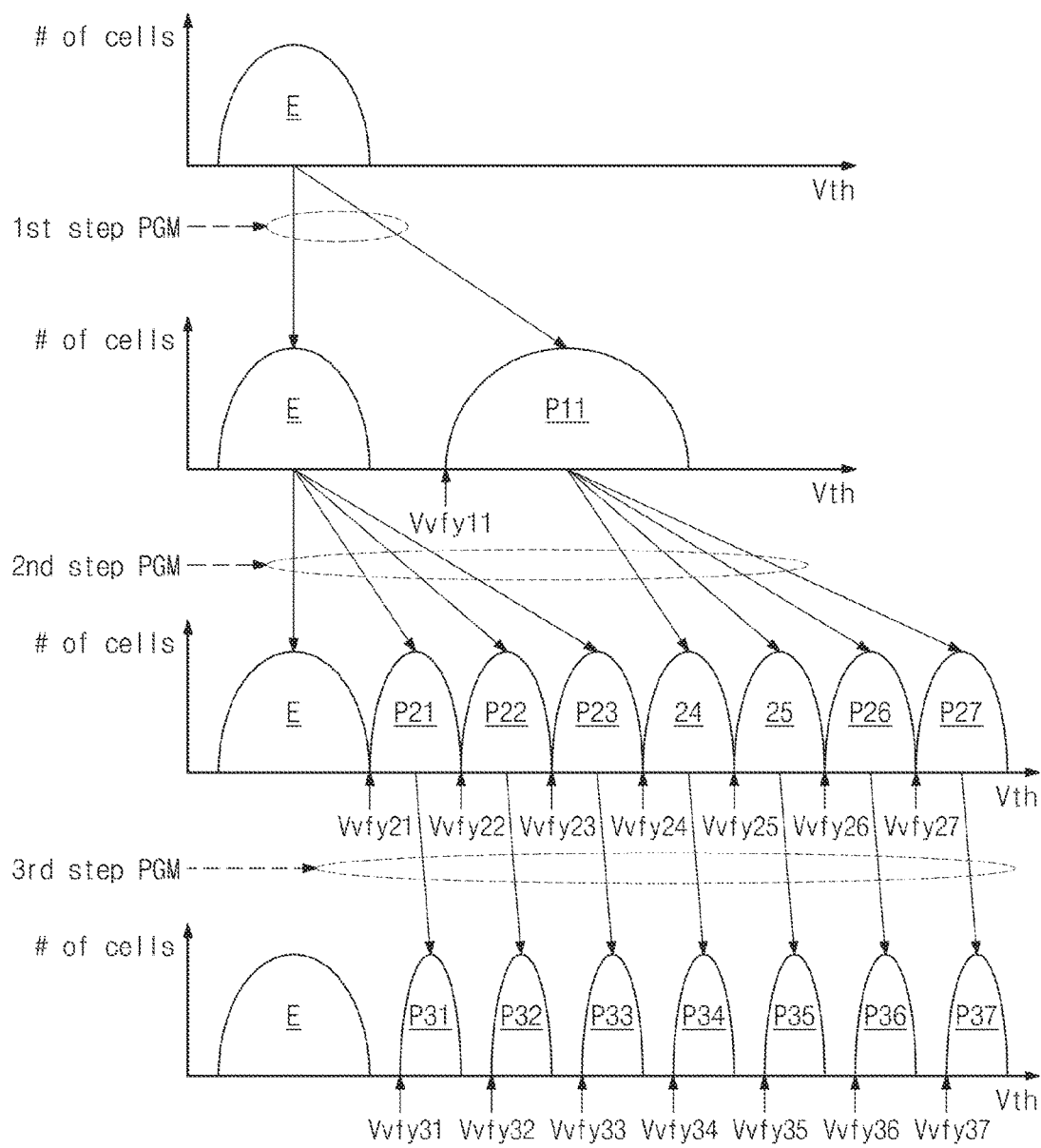
FIG. 13 is a drawing for explaining a reclaim program operation of a nonvolatile memory device in accordance with some other embodiments of the disclosure.

FIG. 13 is a drawing for explaining a reclaim program operation of a nonvolatile memory device in accordance with some other embodiments of the disclosure. More specifically, FIG. 13 is a drawing illustrating a threshold voltage distribution of memory cells connected to a word line selected according to first through third program steps.

To explain a reclaim program operation of the nonvolatile memory device 120 (refer to FIG. 1), it is assumed that each of the selected memory cells is a TLC (triple level cell) storing 3 bits and the nonvolatile memory device 120 performs the first through third program steps to program first through third page data in the selected memory cells. However, the disclosure is not limited thereto and the number of bits stored in each of the memory cells and the number of executed program operations which the nonvolatile memory device 120 performs may be variously changed.

The reclaim program operation illustrated in FIG. 13 includes a first program step, a second program step and a third program step, as a multi-step program method. In the first program step, selected memory cells are programmed to have two program states (E, P11). In the second program step, selected memory cells are programmed to have eight program states (E, P21, P22, P23, P24, P25, P26, P27). In the third program step, data is programmed so that a threshold voltage distribution corresponding to the program states (E, P21, P22, P23, P24, P25, P26, P27) formed in the second program step becomes narrower. That is, in the third program step, a width of threshold voltage distribution of the program states formed in the second program step is more densely programmed to form a final threshold voltage distribution of the program states. As described in FIG. 12, an increment of a program voltage in the third program step is smaller compared with an increment of a program voltage in the second program step. Also, amplitudes (Vvfy31, Vvfy32, Vvfy33, Vvfy34, Vvfy35, Vvfy36, Vvfy37) of verify voltages in the third program step are greater than amplitudes (Vvfy21, Vvfy22, Vvfy23, Vvfy24, Vvfy25, Vvfy26, Vvfy27) of verify voltages in the second program step.

FIG. 13 illustrates a reclaim program operation of a nonvolatile memory device that programs 3-bit data per memory cell as an illustration. A normal program operation also programs 3-bit data per memory cell and its program method may be the first through third program operations such as illustrated in FIG. 13. In this case, a width of a final threshold voltage distribution of memory cells formed by the normal program operation may be greater than a width of a final threshold voltage distribution of memory cells formed by the reclaim program operation. That is, a read margin of data programmed according to the normal program operation may be smaller than a read margin of data programmed according to the reclaim program operation.

As described above, the memory system of the disclosure performs the program operation according to the read reclaim operation differently from another program operation, for instance, the normal program operation. A period in which a read reclaim operation is performed with respect to the same data may become longer by forming a threshold voltage distribution, through the read reclaim operation, to be denser as compared with a threshold voltage distribution formed by the normal program operation. This can reduce an increase of WAF and thereby a lifespan of the memory system can be improved. This can also reduce performance degradation of the memory system due to a frequent read reclaim.

Figure 14:
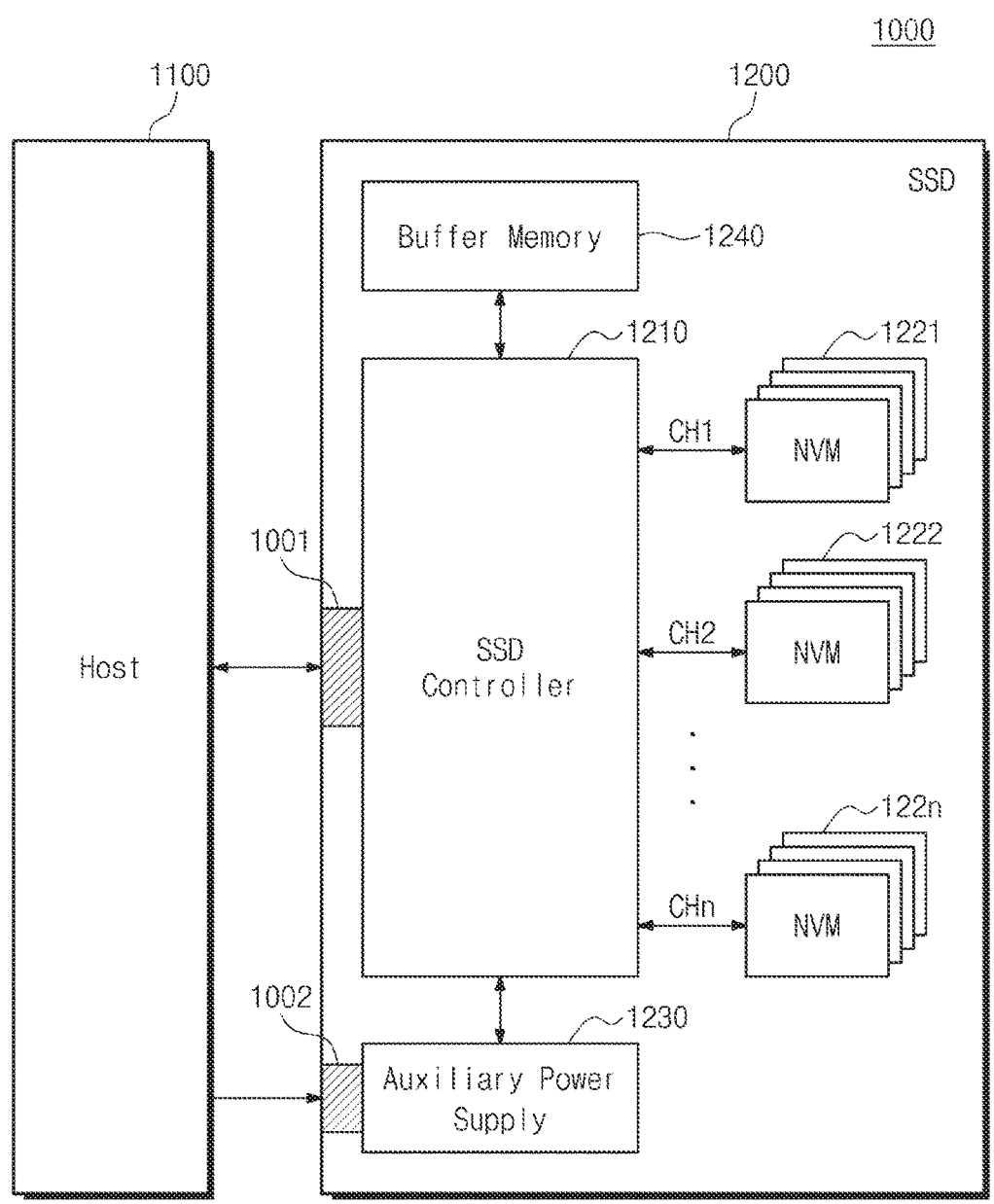
FIG. 14 is a block diagram illustrating a SSD (solid state drive) including a nonvolatile memory device in accordance with some embodiments of the disclosure.

FIG. 14 is a block diagram illustrating an SSD (solid state drive) including a nonvolatile memory device in accordance with some embodiments of the disclosure. Referring to FIG. 14, an SSD system 1000 includes a host 1100 and an SSD 1200. The SSD 1200 exchanges a signal with the host 1100 through a signal connector 1001 and receives power through a power connector 1002. The SSD 1200 may include an SSD controller 1210, a plurality of flash memories 1221~122n, an auxiliary power supply 1230 and a buffer memory 1240.

The SSD controller 1210 can control the flash memories 1221~122n in response to a signal received from the host 1100. The flash memories 1221~122n can perform a program operation under the control of the SSD controller 1210. The flash memories 1221~122n can perform the reclaim program operation and normal program operation described with reference to FIGS. 1 through 13.

The auxiliary power supply 1230 is connected to the host 1100 through the power connector 1002. The auxiliary power supply 1230 can receive power from the host 1100 to charge it. The auxiliary power supply 1230, in the case that a power supply from the host 1100 is not sufficient, may provide a power supply of the SSD system 1000. The auxiliary power supply 1230 can be located inside or outside the SSD 1200. For example, the auxiliary power supply 1230 is located on a main board and may provide auxiliary power to the SSD 1200.

The buffer memory 1240 operates as a buffer memory of the SSD 1200. For example, the buffer memory 1240 can temporarily store data received from the host 1100 or data received from the flash memories 1221~122n, or can temporarily store meta data (e.g., mapping table) of the flash memories 1221~122n. The buffer memory 1240 may include a volatile memory such as DRAM, SDRAM, DDR SDRAM, LPDDR SDRAM, SRAM, etc. or a nonvolatile memory such as FRAM, ReRAM, STT-MRAM, PRAM, etc.

According to the disclosure, a frequency of the read reclaim operation can be reduced by programming a shape of a threshold voltage distribution, formed by a program operation according to a read reclaim operation, to be sharper than a shape of a threshold voltage distribution formed by another program operation. Thus, the latency due to the read reclaim operation and an increase of WAF (write amplification factor) can be reduced and thereby a lifespan and performance of the memory system can be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The above-disclosed subject matter is to be considered illustrative, and not restrictive, and the appended claims are intended to cover all such modifications, enhancements, and other embodiments, which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A memory system comprising:
a nonvolatile memory device having a first program mode and a second program mode, wherein the second program mode programs data to have a larger read margin than the first program mode; and
a memory controller that controls the nonvolatile memory device to program the data according to the second program mode for a read reclaim operation, wherein:
each of the first program mode and the second program mode programs the data through multi-stage programming, and
each $i^{th}$ stage of the multi-stage programming, where i is an integer greater than zero, is the same for both the first program mode and the second program mode, but the second program mode has more stages of the multi-stage programming than does the first program mode.

2. The memory system of claim 1, wherein the first program mode is applied to programming operations other than the read reclaim operation.

3. The memory system of claim 1, wherein the nonvolatile memory device comprises a three-dimensional memory array.

4. The memory system of claim 1, wherein an Incremental Step Pulse Programming (ISPP) technique is applied for each of the first program mode and the second program mode.

5. The memory system of claim 1, wherein each of the first program mode and the second program mode programs multi-bit data in one memory cell.

6. The memory system of claim 1, wherein the data programmed according to the second program mode is retrieved from a first block of memory cells of the nonvolatile memory device and programmed within a second block of the memory cells that differs from the first block of memory cells.

7. The memory system of claim 1, wherein:
the memory controller controls the nonvolatile memory device to program each of the memory cells to one of multiple programming states, and
a voltage margin between voltage threshold distributions of adjacent programming states is greater for the memory cells of the nonvolatile memory device programmed according to the second program mode than for those programmed according to the first program mode.

8. The memory system of claim 1, wherein the memory controller controls the nonvolatile memory device to program the data within selected memory cells of the nonvolatile memory device according to the second program mode when a bit error rate corresponding to the data, as read from the nonvolatile memory device, exceeds a predetermined rate.

9. A memory system comprising:
a nonvolatile memory device having a normal program mode and a reclaim program mode, wherein the reclaim program mode programs data to have a larger read margin than the normal program mode; and
a memory controller that detects error bits of read data readout from the nonvolatile memory device and controls the nonvolatile memory device to program the read data into a free block of the nonvolatile memory device in the reclaim program mode when a number of detected error bits exceeds a reference value, wherein:
each of the normal program mode and the reclaim program mode programs the data through multi-stage programming, and
each $i^{th}$ stage of the multi-stage programming, where i is an integer greater than zero, is the same for both the normal program mode and the reclaim program mode, but the reclaim program mode has more stages of the multi-stage programming than does the normal program mode.

10. The memory system of claim 9, wherein an Incremental Step Pulse Programming (ISPP) technique is applied for each of the reclaim program mode and the normal program mode.

11. The memory system of claim 9, wherein the nonvolatile memory device comprises a three-dimensional memory array.

12. The memory system of claim 9, wherein the data programmed according to the reclaim program mode is retrieved from a first block of memory cells of the nonvolatile memory device and programmed within a second block of the memory cells that differs from the first block of memory cells.

13. The memory system of claim 9, wherein:
the memory controller controls the nonvolatile memory device to program each of memory cells of the nonvolatile memory device to one of multiple programming states, and
a voltage margin between voltage threshold distributions of adjacent programming states is greater for the memory cells of the nonvolatile memory device programmed according to the reclaim program mode than for those programmed according to the normal program mode.

14. A memory system comprising:
a nonvolatile memory device comprising a plurality of memory cells; and
a memory controller that controls the nonvolatile memory device to program data within selected ones of the memory cells of the nonvolatile memory device according to each of a general programming mode and a read reclaim mode, wherein data programmed according to the read reclaim mode has a narrower voltage threshold distribution within the selected memory cells than data programmed according to the general programming mode, wherein:
each of the general programming mode and the read reclaim mode programs the data through multi-stage programming, and
each stage of the multi-stage programming is the same for both the general programming mode and the read reclaim mode, except a last stage of the multi-stage programming.

15. The memory system of claim 14, wherein the data programmed according to the read reclaim mode is retrieved from a first block of the memory cells of the nonvolatile memory device and programmed within a second block of the memory cells that differs from the first block of memory cells.

16. The memory system of claim 14, wherein:
the memory controller controls the nonvolatile memory device to program each of the memory cells to one of multiple programming states, and
a voltage margin between voltage threshold distributions of adjacent programming states is greater for the memory cells of the nonvolatile memory device programmed according to the read reclaim mode than for those programmed according to the general programming mode.

17. The memory system of claim 14, wherein the memory controller controls the nonvolatile memory device to program the data within the selected memory cells according to the read reclaim mode when a bit error rate corresponding to the data, as read from the nonvolatile memory device, exceeds a predetermined rate.

* * * * *